United States Patent [19]

Fuchs

[11] Patent Number: 5,355,019
[45] Date of Patent: Oct. 11, 1994

[54] DEVICES WITH TAPE AUTOMATED BONDING

[75] Inventor: Harold E. Fuchs, Kansas City, Mo.

[73] Assignee: AT&T Bell Laboratories, Murray Hill, N.J.

[21] Appl. No.: 845,898

[22] Filed: Mar. 4, 1992

[51] Int. Cl.⁵ ............... H01L 23/48; H01L 29/44; H01L 29/52; H01L 29/60
[52] U.S. Cl. ............................ 257/698; 257/786
[58] Field of Search ............ 357/80, 74, 67, 70; 257/786, 698, 692, 693, 782; 174/261

[56] References Cited

U.S. PATENT DOCUMENTS

| | | |
|---|---|---|
| 3,269,861 | 8/1966 | Schneble, Jr. et al. . |
| 3,791,848 | 2/1974 | DeAngelo . |
| 3,832,769 | 9/1974 | Olyphant, Jr. et al. ............ 174/261 |
| 3,868,724 | 2/1975 | Berrino ............................... 257/668 |
| 4,814,855 | 3/1989 | Hodgson et al. ..................... 357/69 |
| 4,976,808 | 12/1990 | Ogasawara ........................... 156/638 |
| 5,065,227 | 11/1991 | Frankeny et al. ..................... 357/80 |
| 5,065,228 | 11/1991 | Foster et al. ........................ 257/698 |
| 5,089,881 | 2/1992 | Panicker ............................... 357/80 |

FOREIGN PATENT DOCUMENTS

| | | | |
|---|---|---|---|
| 0189975 | 8/1986 | European Pat. Off. | ............... 357/70 |
| 0368262 | 5/1990 | European Pat. Off. . | |
| 0452506 | 10/1991 | European Pat. Off. . | |

OTHER PUBLICATIONS

"Integration Techniques for Electronically Active Elements and Circuits"—Hui—Technical Notes RCA.

*Primary Examiner*—Rolf Hille
*Assistant Examiner*—S. V. Clark
*Attorney, Agent, or Firm*—Lester H. Birnbaum

[57] ABSTRACT

Disclosed is a method for fabricating devices, and the resulting products, using Tape Automated Bonding (TAB) technology. Via holes are formed through a flexible insulating layer, such as polyimide, and are plated through when conductive fingers are formed on one surface of the layer. The resulting structure is then bonded to a semiconductor chip by means of the conductive pads formed on the surface of the insulating layer opposite to the conductive fingers.

9 Claims, 4 Drawing Sheets

DEVICES WITH TAPE AUTOMATED BONDING

BACKGROUND OF THE INVENTION

This invention relates to devices employing Tape Automated Bonding (TAB) technology.

In semiconductor device fabrication, TAB is an alternative to the common practice of wire bonding between semiconductor chip pads and lead frames. The TAB approach seems to be enjoying a resurgence of interest since present and future devices require denser pin-outs and interconnections.

In a typical TAB device, conductive fingers are formed on a flexible insulating material, usually polyimide. The conductive fingers extend from the edges of the polyimide to an area in the center. This center portion is removed so that the fingers extend beyond the edges of the cut-away portion and make direct contact with the pads of a semiconductor chip.

There are at least three significant problems with the present TAB technology. First, insulating material such as polyimide can be difficult to selectively etch. Second, once the center section has been removed, the ends of conductive fingers are unsupported, and, therefore, can be difficult to align with the chip pads. Third, it has generally been difficult with the present technology to bond to an array of chip pads which include pads not located on the periphery of the chip surface.

One recent proposal for bonding to an area array of pads has involved forming via holes through a polyimide layer and then forming bonding balls at the ends of the conductive fingers overlying the holes for bonding the fingers to a semiconductor chip positioned below the layer. (See U.S. Pat. No. 4,814,855 issued to Hodgson, et al.)

SUMMARY OF THE INVENTION

The invention, in one aspect, is a method for electrically bonding to pads on a semiconductor chip. A layer of a flexible insulating material is provided, and via holes are formed therethrough extending from a first major surface to a second major surface opposite to the first major surface. A plurality of conductive fingers are plated on the first major surface and through the via holes so that a first array of bonding pads is formed on the second major surface at the ends of the via holes. The first array of bonding pads is then electrically bonded to a second array of pads formed on a surface of the semiconductor chip.

In accordance with another aspect, the invention is a device comprising a flexible insulating material having first and second major surfaces. A plurality of conductive fingers is formed on a first major surface. An array of via holes is formed through the insulating material extending from the first major surface to the second major surface. Plated conductive material extends from the first major surface, through the via holes, and terminates in a first array of bonding pads at the second major surface. A semiconductor chip has a second array of bonding pads electrically and mechanically bonded to the first array of bonding pads.

BRIEF DESCRIPTION OF THE DRAWINGS

These and other features of the invention are delineated in detail in the following description. In the drawings.

It will be appreciated that, for purposes of illustration, these figures are not necessarily drawn to scale.

DETAILED DESCRIPTION

Figure 1:
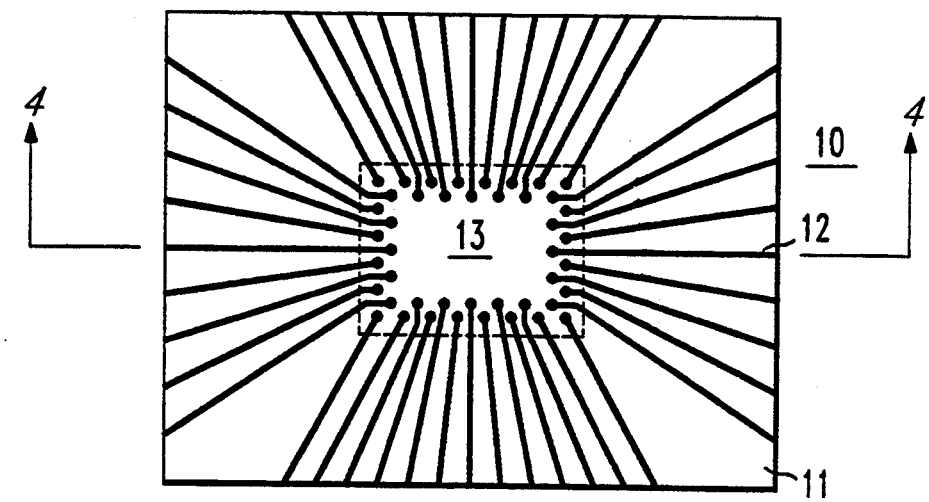
FIG. 1 is a top view of a device in accordance with an embodiment of the invention.

As illustrated in FIG. 1, a typical bonding member, 10, in accordance with the invention includes a flexible insulating tape, 11, which is typically polyimide. The thickness of the tape is generally approximately 50 $\mu m$. Formed on the top major surface of the tape is a plurality of conductive fingers, e.g., 12, which usually extend from the outer edge of the tape to a central portion, 13, indicated by dashed lines. The conductive fingers are usually approximately 35 $\mu m$ thick.

In most prior art schemes, the central portion, 13, would be selectively etched away or mechanically removed with the aid of laser techniques so that the ends of the conductive fingers would extend beyond the edges of the cut-away portion. The ends of the fingers would then be bonded to the pads of a chip placed below the tape and within the boundaries of the cut-away portion.

In accordance with a feature of the invention, the central portion, 13, is not removed. Rather, via holes (e.g., 30 of FIG. 3) are etched or laser drilled through the tape in areas where it is desired to bond the conductive fingers to the chip. When the conductive fingers are formed, as by plating in a manner to be described, the conductive material will extend through the vias and form a first array of bonding pads (e.g., 20) on the opposite major surface of tape 11 as illustrated in the bottom view of FIG. 2. These bonding pads will correspond in number and position to a second array of bonding pads, e.g., 40 of FIG. 4, formed on a surface of a semiconductor chip, 41. Thus, the conductive fingers can be bonded to the second array of pads on the semiconductor chip as shown in FIG. 4 while fully supported by the tape 11.

Figure 4:
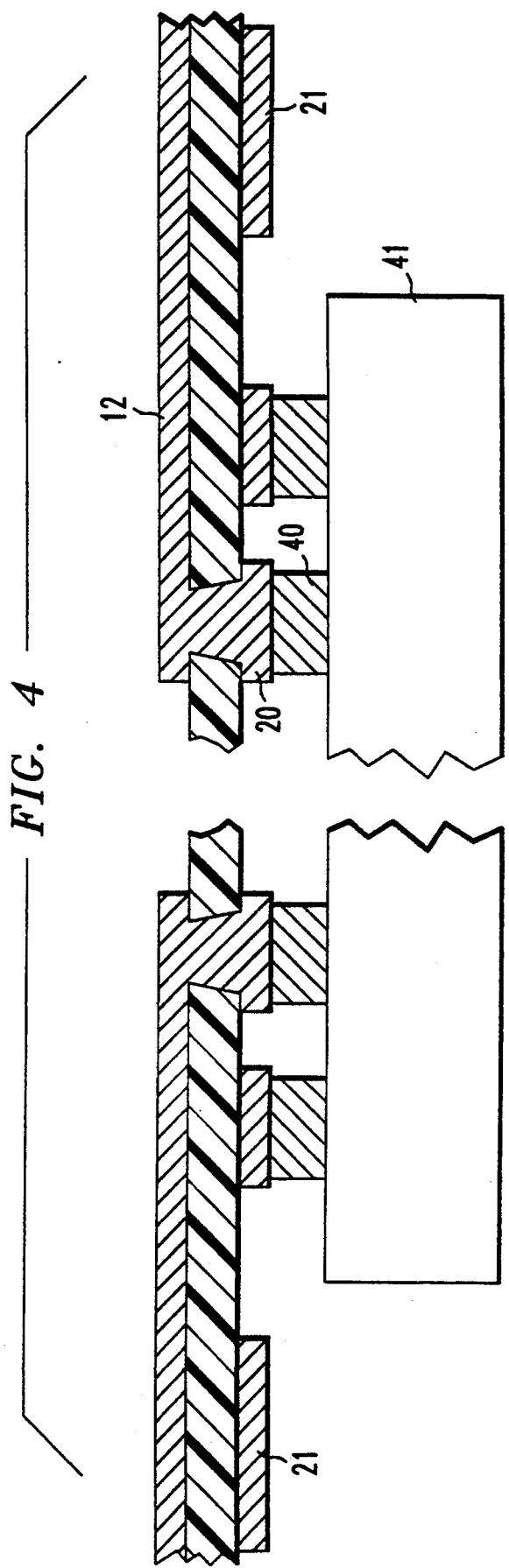
FIG. 4 is a cross-sectional view of an assembly in accordance with an embodiment of the invention including the device of FIG. 1.

It will also be noted in FIG. 4 that an additional advantage of the invention is the ability to easily make contact to any pads within the interior of the array of pads on the chips (e.g., 40).

Figure 2:
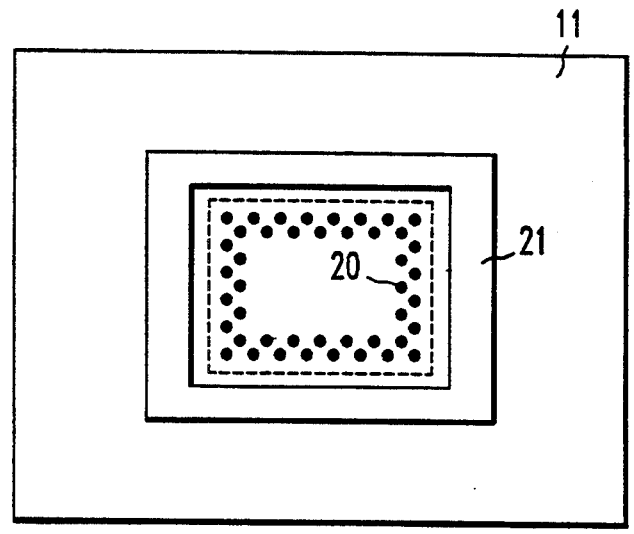
FIG. 2 is a bottom view of the device of FIG. 1.
Figure 3:
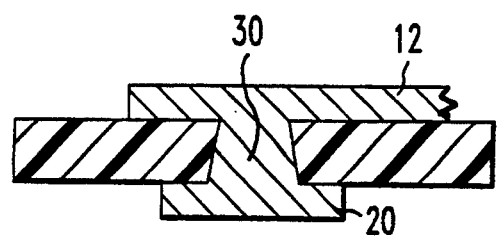
FIG. 3 is an enlarged cross-sectional view of a portion of the device of FIG. 1.

Also included on tape 11, as illustrated in FIGS. 2 and 4, is an area of conductive material, 21, formed on the bottom surface and surrounding the bonding pads, 20. This metal serves as a ground plane for one or more of the conductive fingers on the top surface of the tape, 11, by including vias (not shown) between those selected fingers and the conductive material 21.

An example of the method of producing the device of FIGS. 1-4 will now be described with reference to the flow diagram of FIG. 5. In accordance with step, 50, via holes are laser drilled through the insulating tape, 11, in areas which are to be bonded to the semiconductor chip pads and in areas where contact is to be made between conductive fingers and the ground plane (21 of FIG. 2).

Any standard laser, such as an Excimer or $CO_2$ laser, which is usually employed for drilling can be used in this step. The holes are, typically, approximately 50 microns in diameter. However, the invention is most advantageous wherever via holes of less than 100 $\mu m$ are utilized. Usually, via holes in the range 25 to 75 $\mu m$ will be employed.

In accordance with step, 51, both surfaces of the tape are activated to permit formation of metal layers thereon. That is, the surfaces are etched by any of a number of standard procedures in order to improve adhesion of a metal layer to the surface. For example, the tape can be inserted in a bath comprising an alkali metal hydroxide and ethylene diamine. (See, e.g., U.S. Pat. No. 3,791,848 issued to DeAngelo.) Alternatively, the tape may be inserted into separate baths of ethylene aliamine, an alkali metal hydroxide, stannous chloride and palladium chloride, separated by rinses in de-ionized water.

Figure 6:
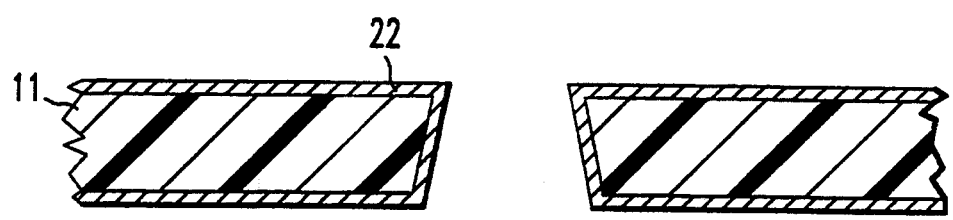
FIGS. 6-8 are cross-sectional views of the portion of FIG. 3 during various stages of fabrication.

The treated tape is then exposed to an electroless nickel plating solution, such as nickel sulfamate, so that a very thin nickel layer is formed on essentially the entire area of both major surfaces as shown in step 52. Typically, the thickness of the nickel coating will be approximately 0.5 to 1.0 micron. The nickel layer will form on both major surfaces of the tape and on the walls of the via holes as illustrated in FIG. 6 where the nickel layer is designated as 22.

Figure 5:
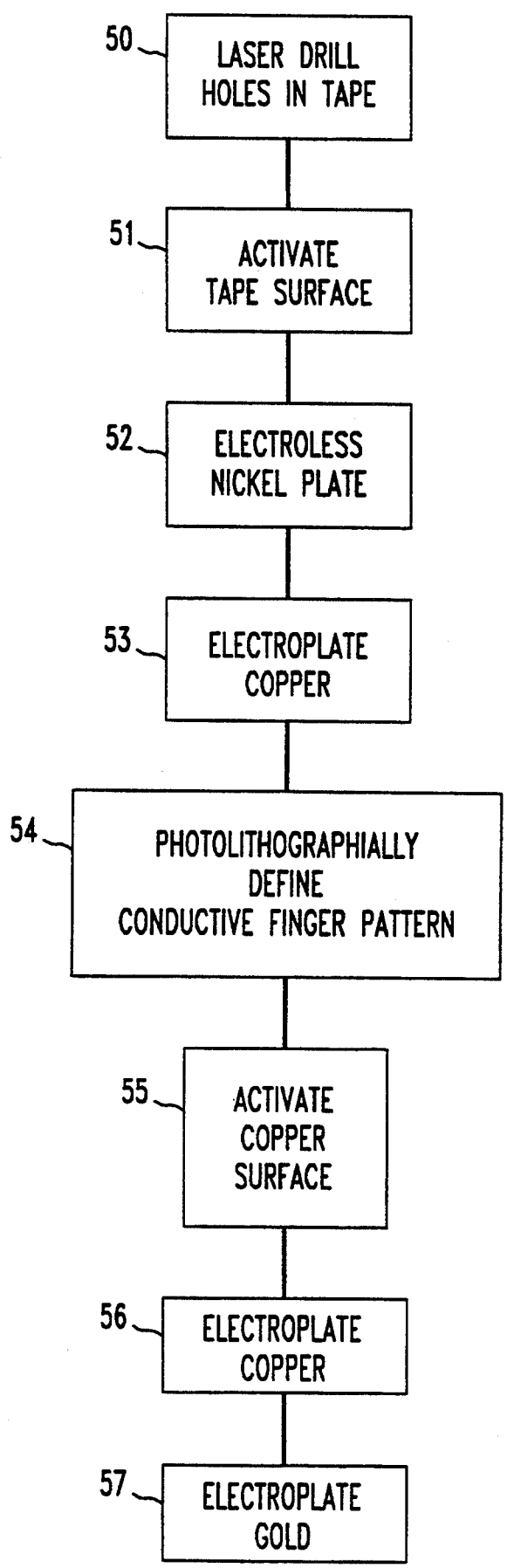
FIG. 5 is a flow diagram illustrating a method of forming the device of FIGS. 1-3 in accordance with one embodiment.
Figure 7:
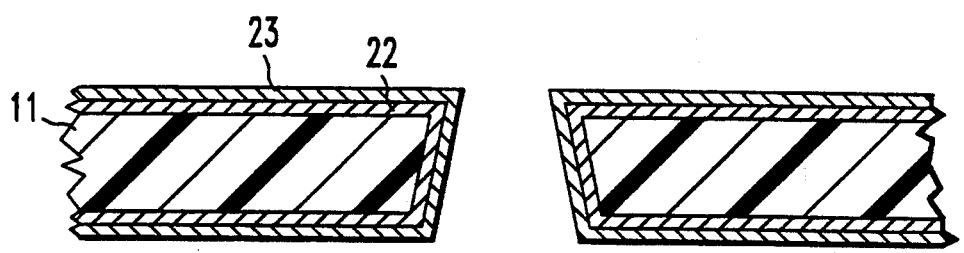

Next, as illustrated by step 53 of FIG. 5, the resulting structure is subjected to a copper electroplating procedure in order to form a thin copper layer over the nickel layer. Any standard bath can be used, such as an acid copper bath. The thickness of this layer (23 of FIG. 7) is typically in the range 1 to 2 microns. The copper layer, shown as layer 23 of FIG. 7, also forms on the sidewalls of the vias.

Figure 8:
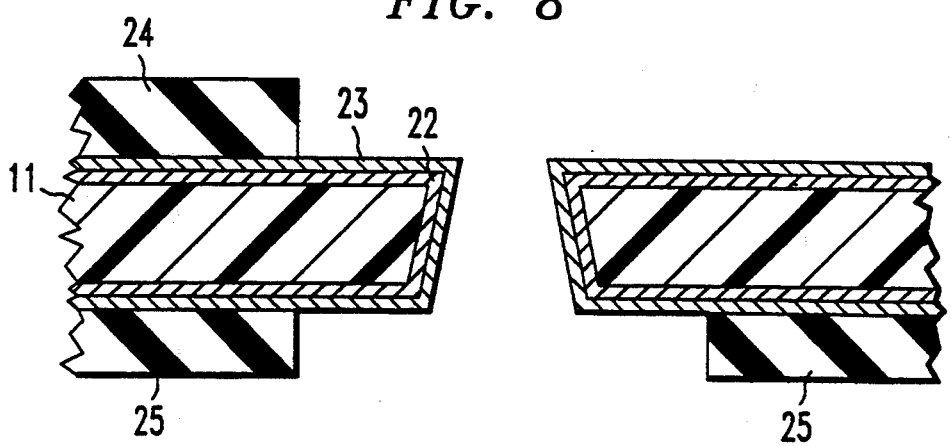

As illustrated in step 54, the areas which will comprise the conductive fingers are defined by standard photolithography. This involves depositing a layer of photoresist on both surfaces, exposing the photoresist layer through a mask, and then etching off the portions of photoresist above the areas of the copper layer, 23, where it is desired to plate the conductive fingers. At this stage, the areas around a via are as illustrated in FIG. 8, where the photoresist is shown as layer 24 on the top surface and layer 25 on the bottom. The photoresist layer, 25, on the bottom surface can be patterned to form a land area around the via as shown, or the photoresist can cover the entire bottom surface if no land areas are needed.

After patterning the photoresist, as illustrated in step 55, the exposed copper on the top and bottom stirfaces and in the via holes is activated by applying a solution thereto which etches and wets the surface in order to ensure proper plating through the via holes in the next step. The particular solution employed comprised 95 vol percent $H_2O$, 4.8 vol percent $H_2SO_4$ and 0.20 weight percent of a wetting agent which was ammonium lauryl sulfate. The solution was applied by submerging the device in the solution with vigorous agitation of the solution for a period of 1 to 2 minutes.

In the next step, illustrated as step 56, the areas of the copper layer left exposed by the photoresist are built up by another plating procedure. This plating step will form the conductive fingers (e.g., 12 of FIG. 3) on the top surface, fill the vias with copper, and, if desired, form a land on the opposite surface around the via holes. (It will be appreciated that FIG. 3 omits the layers 22 and 23 for purposes of clarity in the illustration.) The thickness of the plated copper layer in this step will typically be in the range 30 to 35 microns.

In the particular plating step employed in this example, the device was immersed in a plating bath comprising 25 oz/gal copper sulfate, 5 oz/gal $H_2SO_4$ and 35 to 75 ppm HCl with the bath held at approximately 18 to 22 degrees C. The bath was agitated by introducing air therein at a flow rate of 500 SCCM although a rate of 400 to 750 SCCM would be advantageous. A current density of 0.028 amps/$cm^2$ was applied to the cathode. A current density in the range 0.018 to 0.060 amps/$cm^2$ should be useful. The device was subjected to this plating step for a period of time within the range 20 to 60 minutes. (For a more detailed discussion of a plating procedure which may be utilized with the present invention, see U.S. Patent Application of Fuchs et al, Ser. No. 07/631,295 filed Dec. 20, 1990 and incorporated by reference herein.)

The copper plated areas are then gold plated using a standard plating solution in order to form a thin gold top layer over the fingers and land areas as represented by step 57 of FIG. 5. The thickness of the gold layer is typically 0.1 to 0.2 micron. When the photoresist layer (24, 25) is removed, typically by applying a standard etchant such as McDermott Metex A and B, the portions of layers 22 and 23 thus exposed and removed with a suitable etchant so that the conductive fingers (and lands) are isolated from one another as required. A final gold plating step is then usually performed in order to insure that the edge portion of all base metal surfaces are gold plated. The final thickness of gold on the surface of the conductive fingers and lands is approximately 2.5 microns.

In order to bond the device to a semiconductor chip, as shown in FIG. 4, the bonding pads (e.g., 20) formed on the bottom surface of the device are aligned with corresponding bonding pads (e.g., 40) on the semiconductor chip. In this example, the corresponding pads were electrically and mechanically bonded by thermocompression bonding. That is, heat was applied to the conductive fingers (e.g., 20) and transferred to the pads while the corresponding pads were pressed together. Typically, the devices would be heated to a temperature in the range of 250 to 325 degrees C. while a force of 6340 to 9540 kg/$cm^2$ is applied.

I claim:

1. A device comprising:
    a flexible insulating material having first and second major surfaces;
    a plurality of conductive fingers formed on the first major surface;
    an array of via holes formed through the insulating material extending from the first major surface to the second major surface;
    conductive material formed by a single electroplating step so that the material extends continuously from the conductive fingers, through the via holes, and terminates in a first array of bonding pads at the second major surface; and
    a semiconductor chip having a second array of bonding pads electrically and mechanically bonded to the first array of bonding pads.

2. The device according to claim 1 wherein the insulating material comprises polyimide.

3. The device according to claim 1 wherein the conductive fingers and the plated conductive material comprise copper.

4. The device according to claim 3 further comprising a thin electroless plated layer on the first major surface and on the walls of the via holes.

5. The device according to claim 1 wherein the first array of bonding pads includes land areas formed on the second major surface surrounding the via holes.

6. The device according to claim 1 wherein the second array of bonding pads includes a first set on a periphery of the semiconductor chip surface and a second set positioned interior to said first set.

7. The device according to claim 1 wherein the diameter of the via holes is less than 100 microns.

8. The device according to claim 1 wherein the plated conductive material fills the via holes.

9. The device according to claim 1 wherein the second array of bonding pads is electrically and mechanically bonded to the first array of bonding pads by thermocompression bonding.

* * * * *